United States Patent [19]

Sinha

[11] Patent Number: 4,666,822
[45] Date of Patent: May 19, 1987

[54] METHOD FOR MANUFACTURING A DAMPING LAYER FOR SURFACE WAVE FILTERS

[75] Inventor: Badri Sinha, Munich, Fed. Rep. of Germany

[73] Assignee: Siemens Aktiengesellschaft, Berlin and Munich, Fed. Rep. of Germany

[21] Appl. No.: 770,700

[22] Filed: Aug. 29, 1985

Related U.S. Application Data

[62] Division of Ser. No. 532,827, Sep. 15, 1983, Pat. No. 4,575,653.

[30] Foreign Application Priority Data

Sep. 23, 1982 [DE] Fed. Rep. of Germany ....... 3235236

[51] Int. Cl.$^4$ .......................... G03C 5/00; H01L 41/04
[52] U.S. Cl. .................................... 430/311; 430/319; 310/312; 310/313 R; 333/194
[58] Field of Search ...................... 430/319, 320, 311; 310/312, 313 R; 333/194

[56] References Cited

U.S. PATENT DOCUMENTS

| | | | |
|---|---|---|---|
| 4,037,181 | 7/1977 | Ieki et al. | 333/72 |
| 4,510,410 | 4/1985 | Yuhara et al. | 310/313 D |
| 4,513,262 | 4/1985 | Schofield et al. | 333/194 |

Primary Examiner—John Kittle
Assistant Examiner—José G. Dees
Attorney, Agent, or Firm—Herbert L. Lerner; Laurence A. Greenberg

[57] ABSTRACT

Surface wave filter with a slab-shaped substrate of monocrystalline piezoelectric material, particularly lithium niobate, having input and output transducers optionally coupled by means of a coupler on one substrate side. A plastic and/or elastic damping layer are applied for suppressing reflected waves. The damping layer covers at least in some regions, this substrate side except for the area which is bounded by the transducers, the coupler, the ends of the conductor runs and the regions between the transducers and the coupler. The end face edge of the damping layer increases at least in sections, gradually from zero to the value of the layer thickness.

4 Claims, 5 Drawing Figures

METHOD FOR MANUFACTURING A DAMPING LAYER FOR SURFACE WAVE FILTERS

This is a division of application Ser. No. 532,827, filed Sept. 15, 1983 now U.S. Pat. No. 4,575,653 dated Mar. 11, 1986.

BACKGROUND OF THE INVENTION

1. Field of the Invention

The invention relates to a surface wave filter with a slab-like substrate of monocrystalline piezoelectric material, particularly lithium niobate. On one substrate side of the slab of piezoelectric material are applied input and output transducers which optionally may be coupled by means of a coupler. A plastic and/or elastic damping layer for suppressing reflected waves is applied. This damping layer covers at least in some regions, this substrate side except for the area which is bounded by the transducers, the coupler, the ends of the electric contact runs and the zones between the transducers and the coupler.

2. Description of the Prior Art

In manufacturing the surface wave filters with a substrate of monocrystalline piezoelectric material, a metal layer is customarily vapor-deposited on the substrate, from which the transducers and, if necessary, also the couplers and the contact runs with their ends, are worked out, for instance by means of a photo-etching technique. The so patterned substrate is cemented on a supporting metal sheet and the ends of the conductor runs are electrically connected to the contact legs of the filters by bonding wires. The system is then inserted into a metal or plastic housing and is filled with casting compound.

If electrical signals are fed to the input transducer 2 (see, for instance the example shown schematically in the top view in FIG. 1 and in a side view in FIG. 2, for a known damped surface wave filter with coupler), this transducer 2 emits in the same rhythm surface waves in different directions. The couple 4, which consists, for instance of strip-shaped conductor runs extending parallel to each other, picks up a part of the emitted waves from trandducer 2, specifically that directed toward the coupler 4, and passes it on in the direction toward the output transducer 3 which reconverts it into electrical signals. Reflected waves which are generated at cut edges of the substrate 1 and which are also caused by crystal structure faults in the substrate 1 and are therefore time-delayed and are interfering are suppressed partially by technological measures. For this purpose, a damping compound 9, consisting of a heat adhesive is melted onto the surface between the substrate end face edge and the transducer 2 and similarly a damping compound 10 is melted onto the surface between the other structure face edge and the transducer 3. In this process, however, only a relatively small area parallel to the cut edges of the chip surface can be damped. Consequently, despite damping masses 9 and 10, undesired reflections of waves which have an interfering effect on the transducers 2 and 3 and the coupler 4 which are all applied to the one substrate side of a substrate 1, are unavoidable.

SUMMARY OF THE INVENTION

An object of the present invention is to dampen a surface wave filter on a slab-shaped substrate of monocrystalline piezoelectric material to suppress substantially completely not only the interfering waves caused by the end faces of the substrate and by the most diverse crystal structure faults in the substrate, but also the likewise interfering waves reflected by the end face edges of the damping layers.

With the foregoing and other objects in view, there is provided in accordance with the invention a surface wave filter with a slab-shaped substrate of monocrystalline piezoelectric material comprising a slab-shaped monocrystalline piezoelectric material, input and output transducers optionally coupled by means of a coupler on one substrate side of the slab of piezoelectric material electric, conductor runs extending from the input and output transducers with each run terminating in an end, a damping layer for suppressing partially reflected waves which are generated at cut ends of the substrate and are also caused by crystal structure faults in the substrate, which layer covers at least in some regions said one substrate side except for the area which is bounded by the transducers, the coupler, the ends of the conductor runs and the regions between the transducers and the coupler, the combination therewith wherein the end face edge of the damping layer increases in thickness at least in sections, gradually from zero to the value of the layer thickness to also suppress interfering waves reflected by the end face edge of the damping layer.

In accordance with the invention there is provided a method for producing a damping layer on a slab-shaped monocrystalline piezoelectric material having input and output transducers optionally coupled by means of a coupler on one substrate side of the slab of piezoelectric material, and electric conductor runs extending from input and output transducers with each run terminating in an end, which comprises applying a photoresist layer to the substrate side having the transducers, optionally the coupler, electric conductor runs and their ends, by working out a damping layer from the photoresist layer by photolithographic means to cover at least in some regions said one substrate side except for the area which is bounded by the transducers, the coupler, the ends of the conductor runs and the regions between the transducers and the coupler for suppressing partially reflected waves which are generated at cut edges of the substrate and are also caused by crystal structure faults in the substrate, and effecting gradual increase in thickness of the end face edge of the damping layer from zero to the value of the layer thickness by intended unsharpness of the optical image of the photomask to also suppress interfering waves reflected by the edges of the damping layer.

There is provided in accordance with the invention, a method for producing a damping layer on a slab-shaped monocrystalline piezoelectric material having input and output transducers optionally coupled by means of a coupler on one substrate side of the slab of piezoelectric material, and electric conductor runs extending from input and output transducers with each run terminating in an end, which comprises applying a flowable screen printing mass by silk screening means to cover as a damping layer at least in some regions said one substrate side except for the area which is bounded by the transducers, the coupler, the ends of the conductor runs and the regions between the transducers and the coupler for suppressing partially reflected waves which are generated at cut edges of the substrate and are also caused by crystal structure faults in the substrate, subsequently annealing the damping layer to put it in flow condition to cause the end face edge of the damping layer to decrease gradually from the value of the layer thickness to zero to also suppress interfering waves reflected by the edges of the damping layer.

In accordance with the invention, there is provided a method for producing a damping layer on a slab-shaped monocrystalline piezoelectric material having input and output transducers optionally coupled by means of a coupler on one substrate side of the slab of piezoelectric material, electric conductor runs extending from input and output transducers with each run terminating in an end, which comprises spraying a damping layer through a hole-mask onto the substrate side to cover at least in some regions said one substrate side except for the area which is bounded by the transducers, the coupler, the ends of the conductor runs and the regions between the transducers and the coupler for suppressing partially reflected waves which are generated at cut edges of the substrate and are also caused by crystal structure faults in the substrate, and in the process of spraying controlling a gradual increase in the thickness of the end face edge of the damping layer from zero to the value of the layer thickness by the distance between the hole mask and the substrate to also suppress interfering waves reflected by the edges of the damping layer.

Other features which are considered as characteristic for the invention are set forth in the appended claims.

Although the invention is illustrated and described herein as embodied in a surface wave filter as well as method for manufacturing a damping layer for surface wave filters, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which.

DETAILED DESCRIPTION OF THE INVENTION

Figure 1:
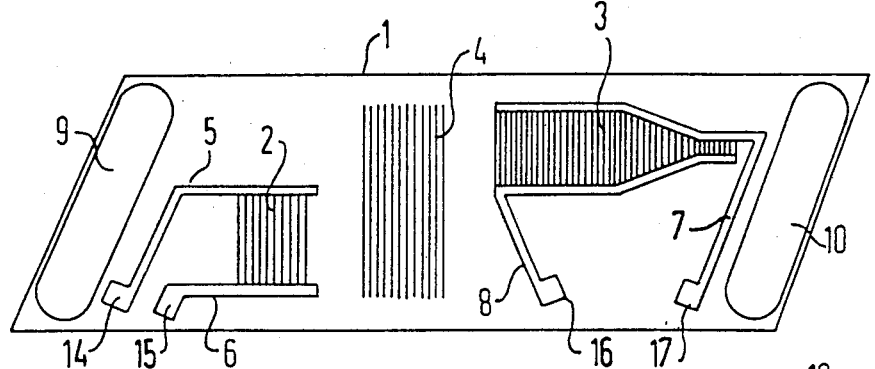
FIG. 1 is a top view of a known damped surface wave filter with substrate of piezoelectric material, shown schematically. The substrate of piezoelectric material has an input transducer and an output transducer coupled by a coupler. At each end of the substrate is a damping compound 9 and 10 respectively.
Figure 2:
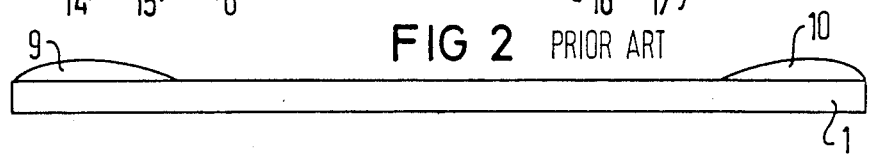
FIG. 2 is a side view of FIG. 1 to show in elevation the damping compound.

In an improved embodiment of a surface wave filter shown in FIGS. 1 and 2, the entire substrate side carrying the active or passive elements of the surface wave filter except for the area which is bounded by the transducers 2 and 3, optionally the coupler 4, the ends 14, 15, 16, 17 of the electric conductor runs 5, 6, 7, 8 and the areas between the transducers and the coupler, is covered by a damping layer consisting of photoresist on a plastic base material.

The damping layer is applied here by means of photolithographic processes; this can optionally be done also by means of screen printing or by means of the so-called hole-mask technique, i.e. by spraying the damping layer on with the interposition of a mask which is cut out in accordance with the desired layer pattern. A top view of the damping layer on the substrate looks like the top view of FIG. 3 in which the damping layer is designated by numeral 11. FIG. 4 shows a side view and it will be noted that the surface of damping layer is level. In spite of good damping properties of the damping mass used, which is substantially determined by the adhesion of the damping mass on the substrate, by the permanent-plastic and/or elastic consistency of the damping mass and by the applied volume of the dampingmass, the thus applied damping layer frequently generates strong interfering reflections. Thereby, the effect desired by the damping layer itself, namely, the far-reaching suppression of the reflected interfering waves is canceled.

To solve this problem, the invention provides in a surface wave filter with a slab-shaped substrate of monocrystalline piezoelectric material, particularly lithium niobate, having input and output transducer optionally coupled by means of a coupler on one substrate side, a damping layer which covers at least in some regions, this substrate side except for the area which is bounded by the transducers, the coupler, the ends of the conductor runs and the regions between the transducers and the coupler, and wherein the end edge of the damping layer rises at least sectionally continuously from zero to the layer thickness. Preferably, this rise should take place along an entire end face edge of the damping layer which faces the transducers and, if present, the coupler of the damping layer and optionally also in the vicinity of the end face edge facing the substrate edges which, except for the area which is bounded by the transducers, the coupler, the ends of the conductor runs and the regions between the transducers and the coupler can cover the entire substrate side carrying the active and passive elements. The angle of the slope is maximally 80° but in particular, about 1° to 60°.

The layer thickness itself is a function of the size of the damping layer and its nature and is customarily chosen so that the layer thickness increases with decreasing area. Expressed differently, this means that a damping layer 11 which covers the whole substrate surface, except the transducers, coupler and connection ends, can be considerably thinner than a damping layer which for example lies only between the end-edges of the narrow side of the substrate and the transducers.

By virtue of the damping layer with respect to thickness increase and area coverage in accordance with the invention, all occurring reflections can be suppressed regardless of which one of the customary suitable methods are used for applying the damping layer as modified in accordance with the invention, as explained in the following.

Thus, according to the invention a photoresist layer or expressed more generally, a light-sensitive synthetic resin can be applied to the substrate side covered with the active elements of the surface wave filter, and the damping layer can be worked out of this layer by means of customary photolithographic methods. The gradual rise of the layer thickness in the region of the end face edge of the damping layer is set by intentional "unsharpness" of the optical image of the photmask. The intended unsharpness of the optical image itself can be controlled by suitable choice of the distance between the substrate and the photoresist mask.

The screen printing technique, if applied with suitable modifications, is also suitable for creating the gradual rise in the region of the end edge of the damping layer. According to the invention, a sufficiently flowable, i.e. non-thixotropic screen printing compound is used which is applied in the customary screen printing process to the substrate side which is covered by the active elements of the surface wave filter. Thereafter the damping layer is brought into a state of flow by means of subsequent programmed annealing such that the end face edge of the damping layer decreases gradually from the value of the layer thickness toward zero. Materials which are suitable with respect to their screen printing as well as damping capability are glass clear unfilled epoxy resins with a two-component base and filled as well as unfilled highly flowably synthetic materials with a one or two component base.

The so-called known hole-mask technique in which the damping layer is sprayed through a hole mask onto the substrate is also suitable for obtaining the rise in the damping layer. The mask precedes the substrate which is cut out according to the desired pattern of the damping layer.

According to the invention, the gradual increase of the layer thickness from zero to the final value of the layer thickness is controlled by the distance between the hole mask and the substrate. The layer thickness itself can be adjusted, as is known, by a suitable choice of the spraying pressure and the spraying time.

High-melting adhesive waxes and paraffins, which are sprayed onto the substrate by means of a heated compressed air gun are preferred material for the damping layer. Synthetic resins which can be sprayed on and exhibit good adhesion, particularly epoxy resins on the basis of one- and two-components are also suitable for the damping layer.

All the methods mentioned can be applied in the processing of the wafers, i.e. in the processing of the substrate disc which is not yet mechanically separated but is divided into many chips in processing. This consequently results in a considerable cost-saving in production because coating of the individual chips is eliminated.

The hole-mask technique has the further advantage in that the end face edges of the damping layer not only exhibit a gradual increase of the layer thickness, but in addition are frayed i.e. do not form a straight line, whereby a further damping effect is obtained. The hole-mask technique can also be carried out on a wire-bonded individual chip, where no time delay occurs; and furthermore, the bonded connecting runs are protected against corrosion. These process steps can be readily carried out by those skilled in the art.

Figure 3:
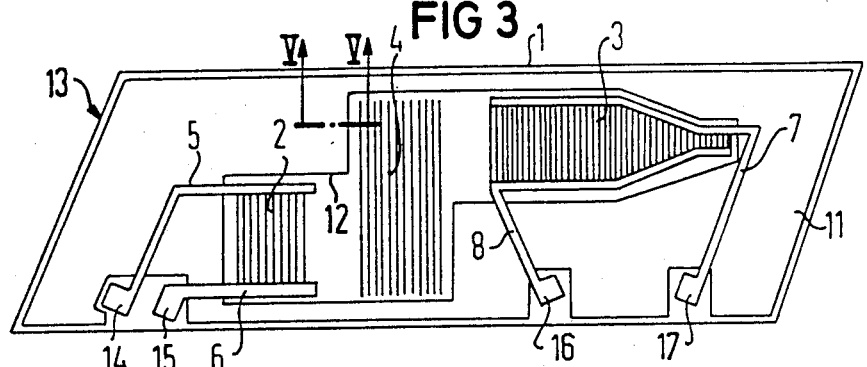
FIG. 3 is a top view showing the same arrangement of elements on the substrate as FIG. 1 but FIG. 3 differs particularly from FIG. 1 in that the damping layer covers the substrate surface except for the areas of the transducers and coupler as shown by a line circumscribing these elements, and the areas of the ends of the electric conductor as shown by an outer line which goes around these ends. The substrate end faces 13 as well as crystal structure faults cause interfering waves.
Figure 4:
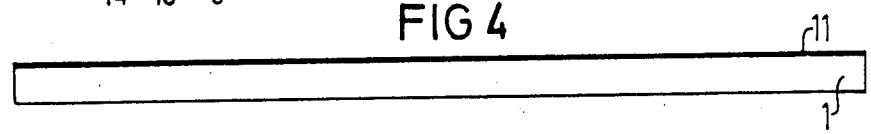
FIG. 4 is a side view of a surface wave filter with substrate which has a surface distribution of elements (transducers and coupler) and an area coverage of damping layer as shown in FIG. 3, but in which the damping layer has a uniform thickness.
Figure 5:
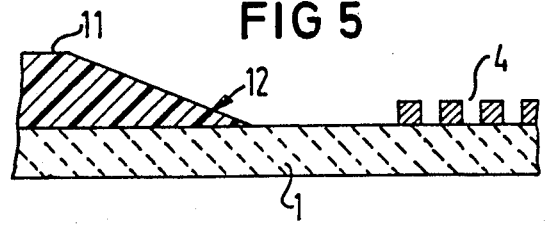
FIG. 5 is a side view of a section taken along line V—V of FIG. 3 and shows the face edge of damping layer gradually increasing from zero to the thickness of the damping layer in accordance with the invention.

A surface wave filter designed and manufactured according to the invention is shown in detail in FIG. 5 which shows a section taken along the line V—V in FIG. 3.

In the embodiment according to FIGS. 3 and 5, the face edge 12 of the damping layer 11 applied to the substrate 1, for instance of thermoplastic material, increases gradually from zero to the value of the layer thickness. Interfering waves which are emitted by the coupler 4 in the direction toward the damping layer 11 can no longer be reflected by the end face edge 12 of the damping layer due to the gradual increase of the layer thickness.

If a coupler is provided, it has been found advantageous in some circumstances to bridge the couple at least partially by a damping layer, for instance by conducting a damping layer in strip shape from the conductor run 5 to the contact run 8.

The foregoing is a description corresponding, in substance, to German application P 32 35 236.0, dated Sept. 23, 1982, international priority of which is being claimed for the instant application, and which is hereby made part of this application. Any material discrepancies between the foregoing specification and the specification of the aforementioned corresponding German application are to be resolved in favor of the latter.

I claim:

1. Method for producing a damping layer on a slab-shaped monocrystalline piezoelectric material having input and output transducers optionally coupled by means of a coupler on one substrate side of the slab of piezoelectric material, and electric conductor runs extending from input and output transducers with each run terminating in an end, which comprises applying a photoresist layer to the substrate side having the transducers, optionally the coupler, electric conductor runs and their ends, by working out a damping layer from the photoresist layer by photolithographic means to cover at least in some regions said one substrate side except for the area which is bounded by the transducers, the coupler, the ends of the conductor runs and the regions between the transducers and the coupler for suppressing partially reflected waves which are generated at cut edges of the substrate and are also caused by crystal structure faults in the substrate, and effecting gradual increase in thickness of the end face edge of the damping layer from zero to the value of the layer thickness by intended unsharpness of the optical image of the photomask to also suppress interfering waves reflected by the edges of the damping layer.

2. Method according to claim 1, wherein the photoresist layer is a light-sensitive synthetic resin.

3. Method according to claim 1, wherein the intentional unsharpness of the optional image is adjusted by varying the distance between the substrate and the mask.

4. Method according to claim 3, wherein the photoresist layer is a light-sensitive synthetic resin.

* * * * *